United States Patent
Nguyen et al.

(10) Patent No.: US 9,824,915 B2
(45) Date of Patent: Nov. 21, 2017

(54) STRUCTURE FOR RADIOFREQUENCY APPLICATIONS AND PROCESS FOR MANUFACTURING SUCH A STRUCTURE

(71) Applicants: Soitec, Bernin (FR); Peregrine Semiconductor Corporation, San Diego, CA (US)

(72) Inventors: Bich-Yen Nguyen, Austin, TX (US); Christophe Maleville, Lumbin (FR); Sinan Goktepeli, San Diego, CA (US); Anthony Mark Miscione, Ramona, CA (US); Alain Duvallet, San Diego, CA (US)

(73) Assignees: Soitec, Bernin (FR); Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/264,821

(22) Filed: Sep. 14, 2016

(65) Prior Publication Data

US 2017/0084478 A1  Mar. 23, 2017

(30) Foreign Application Priority Data

Sep. 17, 2015 (EP) ...................................... 15306431

(51) Int. Cl.
*H01L 21/763* (2006.01)
*H01L 23/66* (2006.01)
(Continued)

(52) U.S. Cl.
CPC ........ *H01L 21/763* (2013.01); *H01L 21/0262* (2013.01); *H01L 21/02381* (2013.01);
(Continued)

(58) Field of Classification Search
CPC ....... H01L 27/13; H01L 21/763; H01L 29/04; H01L 29/16
See application file for complete search history.

(56) References Cited

U.S. PATENT DOCUMENTS 4,914,046 A * 4/1990 Tobin ................ H01L 21/28035
                                                        257/E21.197
2013/0084689 A1     4/2013 Arriagada et al.

FOREIGN PATENT DOCUMENTS

WO     2012087580 A2     6/2012
WO     2012127006 A1     9/2012
(Continued)

OTHER PUBLICATIONS

Bouridah et al., Effect of Thermal Annealing and Nitrogen Content on Amourphous Silicon Thin-Film Crystallization, Phys. Tat. Sol. (a), vol. 204, No. 7, (2007),pp. 2347-2354.
Lederer et al., Fabrication and Characterization of High Resistivity SOI Wafers for RF Applications, ECS Transactions, vol. 16, No. 8, (2008), pp. 165-174.
(Continued)

*Primary Examiner* — Kimberly Rizkallah
*Assistant Examiner* — Mounir Amer
(74) *Attorney, Agent, or Firm* — TraskBritt

(57) ABSTRACT

The invention relates to a structure for radiofrequency applications comprising: a monocrystalline substrate, a polycrystalline silicon layer directly on the monocrystalline substrate, and an active layer on the polycrystalline silicon layer intended to receive radiofrequency components. At least a first portion of the polycrystalline silicon layer extending from an interface of the polycrystalline silicon layer with the monocrystalline substrate layer includes carbon and/or nitrogen atoms located at the grain boundaries of the polycrystalline silicon layer at a concentration of between 2% and 20%. A process for manufacturing such a structure includes, during deposition of at least a first portion of such a polycrystalline silicon layer located at the interface with the monocrystalline substrate, depositing carbon and/or atoms in the at least a first portion.

9 Claims, 2 Drawing Sheets

(51) Int. Cl.
  *H01L 29/04* (2006.01)
  *H01L 29/16* (2006.01)
  *H01L 21/762* (2006.01)
  *H01L 21/02* (2006.01)
  *H01L 27/13* (2006.01)

(52) U.S. Cl.
  CPC .. *H01L 21/02529* (2013.01); *H01L 21/02532* (2013.01); *H01L 21/02595* (2013.01); *H01L 21/7624* (2013.01); *H01L 21/76254* (2013.01); *H01L 23/66* (2013.01); *H01L 29/04* (2013.01); *H01L 29/16* (2013.01); *H01L 27/13* (2013.01)

(56) References Cited

FOREIGN PATENT DOCUMENTS

| WO | 2015112308 | 7/2015 |
| WO | 2016087728 | 6/2016 |

OTHER PUBLICATIONS

European Search Report for European Application No. 15306431.6, dated Dec. 21, 2015, 9 pages.
Kerr et al., Identification of RF Harmonic Distortion on Si Substrates and its Reduction Using a Trap-Rich Layer, 978-1-4244-856-5/08, IEEE 2008 IEEE.
Lederer et al., Enhanced High Resistivity SOI Wafers for RF Applications, IEEE Intl. SOI Conf., pp. 46-47, 2004.
Lederer et al., New Substrate Passivation Method Dedicated to High Resistivity SOI Wafer Fabrication with Increased Substrate Resistivity, IEEE Electron Device Letters, vol. 26 N° 11, pp. 805-807, 2005.
Lederer et al., RF Performance of a Commercial SOI Technology Transferred onto a Passivated HR Silicon Substrate, IEEE Transactions on Electron Devices, vol. 55, N° 7, pp. 1664-1671, 2008.
Singapore Search Report and Written Opinion for Singapore Application No. 10201607776, dated Aug. 2, 2017, 10 pages.

* cited by examiner

US 9,824,915 B2

STRUCTURE FOR RADIOFREQUENCY APPLICATIONS AND PROCESS FOR MANUFACTURING SUCH A STRUCTURE

PRIORITY CLAIM

This application claims the benefit of the filing date of European Patent Application Serial No. 15306431.6, filed Sep. 17, 2015, for "Structure for Radiofrequency Applications and Process for Manufacturing Such a Structure."

TECHNICAL FIELD

The invention relates to a structure for radiofrequency applications and to a process for manufacturing such a structure.

BACKGROUND

In radiofrequency (RF) applications, different types of structures may be used for making RF components.

Among these structures, HR-SOI (acronym for "High-Resistivity Silicon-On-Insulator") type substrates are of interest.

In the present text, "high resistivity" means an electrical resistivity of more than 500 Ohm cm.

A Silicon-On-Insulator (SOI) structure comprises successively a silicon base substrate, a dielectric (e.g., oxide) layer (usually called "buried oxide" (BOX) layer), and a silicon active layer.

To improve the insertion loss, harmonic distortion and isolation performance required for Radiofrequency (RF) switches, the silicon base substrate of an SOI substrate was replaced by a high-resistivity base substrate in order to form an HR-SOI.

The adoption of HR-SOI wafers for RF applications has allowed monolithic integration of RF front-end modules. This leads to smaller size, better reliability, improved performance and lower system cost.

While HR-SOI substrates are well suited for 2G and 3G applications, they suffer from the parasitic surface conduction (PSC) layer induced under the buried oxide due to fixed oxide charges, which attract free carriers near the $Si/SiO_2$ interface.

This drastically reduces the substrate effective resistivity by more than one order of magnitude, limiting the substrate capability in meeting performance requirements for next generation devices.

To address this intrinsic limitation and improve effective resistivity, a polycrystalline silicon layer may be introduced between the dielectric layer and the high resistivity base substrate to provide a trap-rich layer underneath the dielectric layer and impede the PSC.

These traps originate from the grain boundaries of the polycrystalline silicon layer in which RF components are to be made.

Reference can be made to document WO 2012/127006.

FIG. 1 shows an enhanced HR-SOI structure that comprises an HR silicon substrate 1, covered successively by a polycrystalline silicon (also called "polysilicon") layer 2', an oxide layer 4 and a monocrystalline silicon layer 3 that forms the active layer of the substrate 1.

Such an enhanced HR-SOI structure can be made by the SMART CUT® process, which comprises the following steps:
- providing an HR silicon substrate,
- depositing a polycrystalline silicon layer on the HR silicon substrate,
- providing a monocrystalline silicon donor substrate comprising a weakened zone that defines the active layer to be transferred onto the HR silicon substrate; the weakened zone can be obtained by implantation of atomic species into the donor substrate,
- forming a dielectric layer on at least one of the polycrystalline silicon substrate and the monocrystalline donor substrate, e.g., by oxidizing at least one of the substrates,
- bonding the donor substrate and the HR silicon substrate, at least one dielectric layer being at the bonding interface; the at least one dielectric layer forms the BOX layer,
- detaching the donor substrate along the weakened zone, thereby transferring the monocrystalline active layer onto the HR silicon substrate.

The enhanced HR-SOI structure resulting from this process includes residual electrical charges at the interface between the BOX layer and the underlying layer that are due to the implantation and oxidation steps.

The electrical charges deteriorate the RF performance of the components that are later formed in or on the active layer. In particular, the electrical charges may create undesirable interactions between adjacent RF components.

The polycrystalline silicon layer is intended to trap the electrical charges and thus avoid their detrimental effect on the RF performance. Indeed, the surface of the polycrystalline silicon layer comprises a plurality of grain boundaries which allow trapping of the electrical charges at the interface with the BOX layer.

Further information on this subject can be found in publications written by D. Lederer, R. Lobet and J.-P. Raskin, "Enhanced high resistivity SOI wafers for RF applications," IEEE Intl. SOI Conf., pp. 46-47, 2004; D. Lederer and J.-P. Raskin, "New substrate passivation method dedicated to high resistivity SOI wafer fabrication with increased substrate resistivity," IEEE Electron Device Letters, vol. 26, no. 11, pp. 805-807, 2005; D. Lederer and J.-P. Raskin, "RF performance of a commercial SOI technology transferred onto a passivated HR silicon substrate," IEEE Transactions on Electron Devices, vol. 55, no. 7, pp. 1664-1671, 2008; and D. C. Kerr et al., "Identification of RF harmonic distortion on Si substrates and its reduction using a trap-rich layer," 978-1-4244-1856-5/08, IEEE 2008.

However, the manufacturing of such an HR-SOI structure involves some steps carried out at high temperature (e.g., a heat treatment is carried out after bonding in order to reinforce the bonding strength). The high temperature induces recrystallization of the polycrystalline silicon layer, the underlying HR silicon substrate—which is monocrystalline—acting as a seed for such recrystallization. In other words, a recrystallization front propagates through the polysilicon layer from the interface with the HR monocrystalline silicon substrate.

When recrystallizing, the polysilicon layer loses its trapping efficiency due to the drop in the number of grain boundaries and larger grain size variation which could result in larger surface roughness and charge trapping uniformity.

In order to limit recrystallization, the thickness of the polysilicon layer can be set to a sufficiently high thickness such that, at the end of the high temperature step(s), at least a part of the polysilicon layer has not recrystallized yet.

Besides, a large deposited thickness is also needed to compensate the fact that the polysilicon layer has to be polished after deposition in order to reduce its roughness, the polishing step removing a certain thickness of the polysilicon layer.

For these reasons, in current-enhanced HR-SOI structures, the deposited polysilicon layer typically has a thickness thicker than 2 µm.

However, increasing the thickness of the polysilicon layer has a drawback. Indeed, when the polysilicon layer is deposited using chemical vapor deposition (CVD), the polysilicon first forms nuclei on the surface of the HR silicon substrate, and then forms small grains that progressively enlarge in a substantially conical way as the thickness of the polysilicon layer grows. As a result, the surface of the polysilicon layer opposite to the HR silicon substrate comprises less grain boundaries than the surface located at the interface with the HR silicon substrate. Hence, the greater the thickness of the polysilicon layer, the smaller the number of grain boundaries and, thus, the lower the trapping efficiency of the polysilicon layer.

BRIEF SUMMARY

A goal of the present disclosure is to overcome the above-mentioned problems and, in particular, to allow reduction of the thickness of the polycrystalline silicon layer without deteriorating the trapping efficiency of the layer.

Accordingly, the present disclosure provides a structure for radiofrequency applications comprising:
a monocrystalline substrate,
a polycrystalline silicon layer directly on the monocrystalline substrate,
an active layer on the polycrystalline silicon layer, intended to receive radiofrequency components,
the structure being characterized in that at least a first portion of the polycrystalline silicon layer extending from an interface of the polycrystalline silicon layer with the monocrystalline layer includes carbon and/or nitrogen atoms located at the grain boundaries of the polycrystalline silicon at a concentration of between 2% and 20%.

As will be explained in more detail below, the carbon and/or nitrogen atoms are trapped at grain boundaries of the polycrystalline silicon, which slows down the kinetics of the recrystallization process.

This allows a reduction of the thickness of the polysilicon layer while still avoiding complete recrystallization of the layer at the end of the heat treatment(s).

Such a polysilicon layer with a reduced thickness comprises, at the surface opposite to the monocrystalline substrate, a greater number of grain boundaries, and thus more efficiently traps the electrical charges present at the surface relative to a thicker layer. In addition, a smaller thickness of the polysilicon induces a limited surface roughness and thus minimizes the polishing step, and results in higher uniformity in grain size across the wafer and from wafer-to-wafer.

According to an embodiment, the whole polycrystalline silicon layer contains carbon and/or nitrogen atoms.

In such case, the thickness of the polycrystalline silicon layer ranges from 200 nm to 1000 nm.

According to another embodiment, the polycrystalline silicon layer further comprises, on the first portion containing carbon and/or nitrogen atoms, a second portion free from carbon and/or nitrogen atoms.

By "free" is meant that the concentration in carbon and/or nitrogen atoms is less than 0.5%.

In such case, the thickness of the first portion of the polycrystalline silicon layer advantageously ranges from 10 nm to 200 nm. The whole thickness of the polycrystalline silicon layer thus preferably ranges from 20 nm to 500 nm.

According to an embodiment, the monocrystalline substrate comprises at least one of monocrystalline silicon having an electrical resistivity greater than 500 Ohm cm, silicon carbide, and/or germanium.

According to an embodiment, the active layer comprises at least one of a semiconducting material, a dielectric material, a ferroelectric material, and a substructure comprising at least one cavity and at least one suspended element on the cavity.

According to another embodiment, the structure further comprises a dielectric layer on the polycrystalline silicon layer, the active layer being on the dielectric layer.

Additional embodiments of the present disclosure relate to a process for manufacturing such a structure.

The process comprises:
providing a monocrystalline substrate,
depositing, on the monocrystalline substrate, a polycrystalline silicon layer,
providing a donor substrate comprising an active layer intended to receive radiofrequency components,
bonding the monocrystalline substrate and the donor substrate such that the polycrystalline silicon layer and the active layer are at the bonding interface,
transferring the active layer onto the monocrystalline substrate and the polycrystalline silicon layer,
the process being characterized in that, during deposition of at least a first portion of the polycrystalline silicon layer located at the interface with the monocrystalline substrate, carbon and/or atoms are deposited in the first portion.

Advantageously, the polycrystalline silicon layer is deposited by Low-Pressure Chemical Vapor Deposition (LPCVD) in a reactor.

A gas containing carbon and/or nitrogen atoms is introduced in the LPCVD reactor to form at least the first portion.

According to an embodiment, the gas is introduced in the LPCVD reactor during the deposition of the whole polycrystalline silicon layer.

The thickness of the polycrystalline silicon layer thus preferably ranges from 200 nm to 1000 nm.

According to another embodiment, after the first portion has been deposited, the process comprises stopping the introduction of the gas containing the carbon and/or nitrogen atoms in the LPCVD reactor and further depositing a carbon and/or nitrogen-free second portion of the polycrystalline layer, the concentration in carbon and/or nitrogen in the second portion being less than 0.5%.

The thickness of the first region of the polycrystalline silicon layer thus preferably ranges from 10 nm to 200 nm.

According to another embodiment, the process further comprises forming a dielectric layer on the polycrystalline silicon layer and/or on the active layer of the donor substrate.

BRIEF DESCRIPTION OF THE DRAWINGS

Further features and advantages of the present disclosure will become apparent from the detailed description that follows, based on the accompanying drawings, wherein.

DETAILED DESCRIPTION

Figure 2:
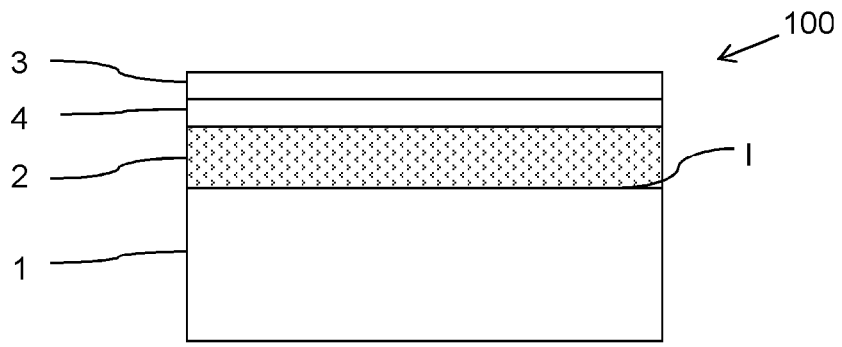
FIG. 2 shows a cross-sectional view of a structure according to an embodiment of the present disclosure.

FIG. 2 illustrates a structure 100 according to a first embodiment of the present disclosure. The structure 100 comprises a monocrystalline substrate 1. The monocrystalline substrate 1 can be a bulk substrate made of a single material or a composite substrate made of a stack of different materials, wherein at least a layer of a monocrystalline material is disposed at a main surface of the substrate.

Advantageously, the monocrystalline substrate 1 is made of monocrystalline silicon having an electrical resistivity greater than 500 Ohm·cm, although other materials could be selected. For example, the following materials could be used to form the monocrystalline substrate 1: silicon, silicon carbide, germanium or a combination of at least two of the materials.

A polycrystalline silicon layer 2 extends directly on the monocrystalline substrate 1. By "directly" is meant that the polycrystalline silicon is in contact with the material of the monocrystalline substrate 1 at the interface I. In other words, no polycrystalline or amorphous layer is interposed between the monocrystalline substrate 1 and the polycrystalline silicon layer 2.

The polycrystalline silicon layer 2 includes carbon and/or nitrogen, meaning that carbon and/or nitrogen atoms are located at least primarily at the grain boundaries of the polycrystalline silicon. As will be explained in more detail below, the carbon and/or nitrogen atoms are typically introduced during growth of the polysilicon.

The concentration of carbon atoms in the polysilicon layer 2 is in the 2%-20% range, which can be determined using chemical composition characterization techniques such as Auger Electron Spectroscopy or Secondary Ion Mass Spectrometry.

The carbon and/or nitrogen concentration may be uniform throughout the thickness of layer 2 or can vary along the thickness of layer 2.

Figure 1:
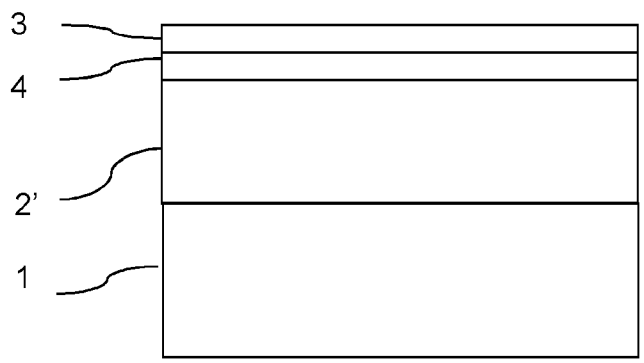
FIG. 1 shows a cross-sectional view of a known semiconductor-on-insulator structure comprising a polysilicon layer.

The thickness of the polycrystalline silicon layer 2 ranges typically from 200 nm to 1000 nm, which is much thinner than in the prior art structure as illustrated in FIG. 1.

A dielectric layer 4, such as an oxide layer, can be present on the polysilicon layer 2. However, this layer 4 is optional.

The structure 100 then comprises, on the polysilicon layer 2 (or, if present, on the dielectric layer 4), an active layer intended to receive radiofrequency components. The radiofrequency components can thus be formed on or in the active layer 3.

The active layer 3 can comprise a semiconducting material, a dielectric material, a ferroelectric material, and/or a substructure comprising at least one cavity and at least one suspended element on the cavity.

Figure 3:
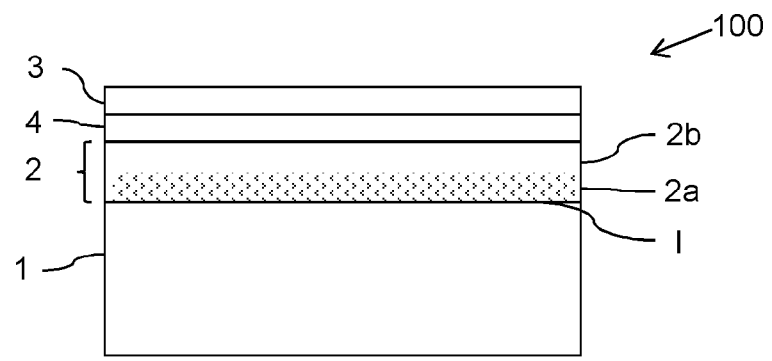
FIG. 3 shows a cross-sectional view of a structure according to another embodiment of the present disclosure.

FIG. 3 illustrates a structure 100 according to a second embodiment of the invention. Elements designated by the same reference numerals as in FIG. 2 are the same and thus need not being described in detail again.

As compared to the structure of FIG. 2, the structure of FIG. 3 comprises a polysilicon layer 2 that is made of two portions: a first portion 2a, extending from the interface I and a second portion 2b, extending on the first portion 2a. The first portion 2a includes carbon and/or nitrogen. The concentration of carbon and/or nitrogen atoms in the first portion 2a of the polysilicon layer 2 is in the 2%-20% range. The thickness of the first portion 2a ranges from 10 nm to 200 nm.

By contrast, the second portion 2b is substantially free from carbon and/or nitrogen atoms. Assuming that some carbon and/or nitrogen atoms may have contaminated the second portion, for example, during the manufacturing process, the concentration in carbon and/or nitrogen atoms of the second portion 2b is less than 0.5%.

A manufacturing process of the structures illustrated in FIGS. 2 and 3 is described with reference to FIGS. 4A to 4D.

Figure 4A:
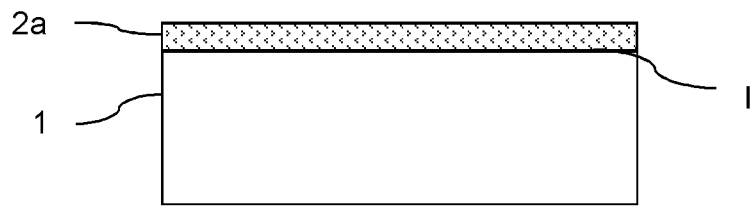
FIGS. 4A to 4D show several steps of the manufacturing process of a structure according to the present disclosure.

On the one hand, as shown in FIG. 4A, a monocrystalline substrate 1 is provided.

The substrate 1 is introduced in a reactor so as to carry out deposition of the polycrystalline layer. The deposition technique is advantageously Low-Pressure Chemical Vapor Deposition (LPCVD) or plasma-enhanced LPCVD.

To that end, silane ($SiH_4$), disilane ($S_2H_6$) or trisilane ($Si_3H_8$) and methane ($CH_4$) or methylsilane ($SiH_3CH_3$) are introduced in the reactor. The temperature in the reactor typically ranges from 500° C. to 900° C.

Concurrently with the introduction of methylsilane or methane, a gas containing carbon and/or nitrogen is introduced into the reactor, so as to introduce the carbon and/or nitrogen atoms into the polysilicon layer being grown. The concentration of the carbon and/or nitrogen-containing gas is comprised between 50 and 300 sccm.

As a result, a first portion 2a of polysilicon including carbon and/or nitrogen is obtained on the monocrystalline substrate 1. The thickness of this first portion 2a is between 10 nm and 200 nm.

According to an embodiment, the growth of polysilicon along with introduction of the carbon and/or nitrogen-containing gas can be continued until a final polysilicon layer having a thickness between 200 nm and 1000 nm is obtained. In such case, the whole polysilicon layer includes carbon and/or nitrogen (FIG. 4B, left).

Figure 4B:
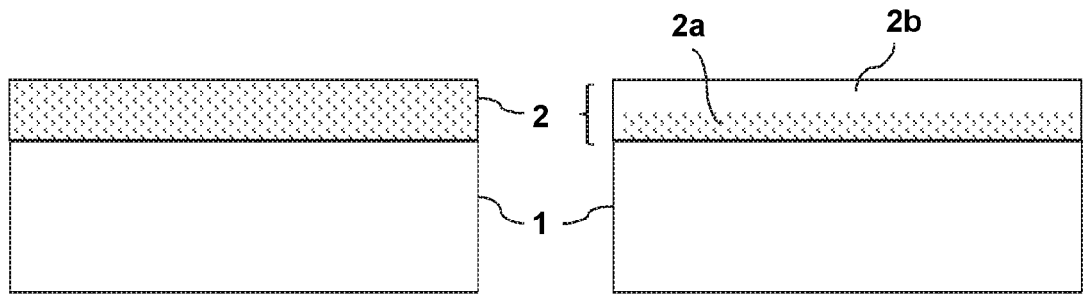

According to an alternative embodiment, the introduction of the carbon and/or nitrogen-containing gas is stopped after formation of the first portion 2a, and the growth of a second portion 2b of carbon and/or nitrogen-free polysilicon is continued until obtaining a total thickness of the polysilicon layer 2 of from 20 nm to 500 nm (FIG. 4B, right). The advantage of this embodiment is that the quantity of carbon introduced in the reactor is limited and that dirtying of the reactor walls by carbon is thus minimized. Thus, the reactor requires less cleaning than in the previous embodiment.

Then, the monocrystalline substrate 1 covered with the polysilicon layer 2 is removed from the reactor.

Figure 4C:
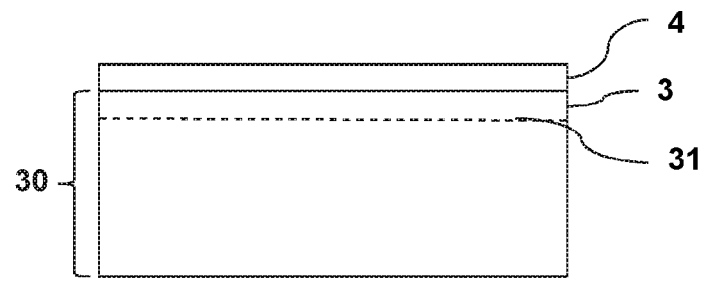

On the other hand, as shown in FIG. 4C, a donor substrate 30 comprising a layer 3 intended to form the active layer of the structure is provided. The layer 3 can be delimited in the donor substrate 30, for example, by a weakness zone 31. The weakness zone 31 can be formed by implantation of atomic species or by any other suitable process. These techniques are known per se and do not need to be described in more detail here.

A dielectric layer may be formed on the polysilicon layer and/or on the active layer of the donor substrate. For instance, the dielectric layer can be obtained by an oxidation of the polysilicon layer and/or of the donor substrate. By way of example, such a dielectric layer 4 is illustrated on the active layer 3 of the donor substrate 30 in FIG. 4C. When dielectric layers are formed on both the polysilicon layer and on the donor substrate, both dielectric layers form together, after bonding, a buried dielectric layer.

Figure 4D:
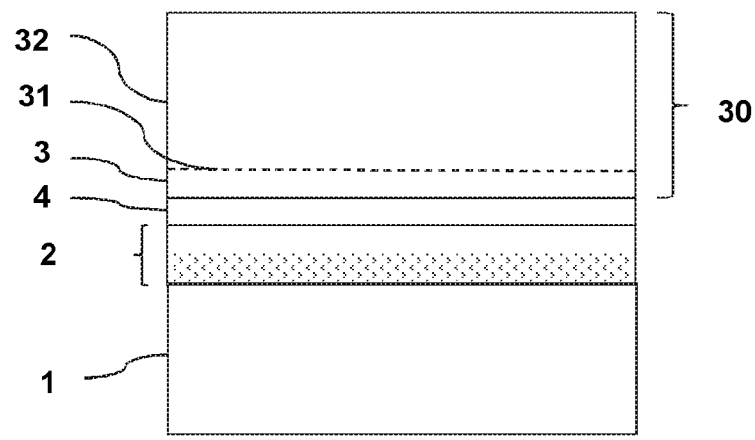

Then, as shown in FIG. 4D, the monocrystalline substrate 1 and the donor substrate 30 are bonded such that the polycrystalline silicon layer 2 and the active layer 3 (or, if appropriate, the dielectric layer(s) present on layers 2 and/or 3) are at the bonding interface.

A thermal treatment is carried out to reinforce the bond strength. The temperature of this thermal treatment is typically between 100° C. and 1250° C., and its duration generally ranges from 10 seconds to 2 hours.

The thermal budget of such a treatment would be sufficient to induce recrystallization of a polysilicon layer from the interface with the monocrystalline substrate that forms a seed for recrystallization. However, due to the presence of carbon atoms in at least the portion 2a of the polysilicon layer in contact with the monocrystalline substrate 1, the recrystallization kinetics are substantially slowed down since the carbon atoms block the grain boundaries of the polysilicon. Thus, even with a polysilicon region containing carbon and/or nitrogen having a thickness as small as about 100 nm, the polysilicon layer 2 will not recrystallize completely at the end of the thermal treatment.

The active layer 3 is then transferred onto the monocrystalline substrate 1 and polysilicon layer 2 by removing the remainder 32 of the donor substrate 30. The removal can be carried out by fracturing the donor substrate 30 along the weakness zone 31 (SMART CUT® process), or by etching and/or grinding the donor substrate so as to leave only the active layer 3.

The resulting structure is shown in FIG. 2 (in the case of a polysilicon layer containing carbon and/or nitrogen on its whole thickness) or in FIG. 3 (in the case where only the first portion of the polysilicon layer includes carbon and/or nitrogen).

In such a structure, the polysilicon layer 2 has a thickness of between 200 nm to 1000 nm (or even from 10 nm to 500 nm in the situation depicted with reference to FIG. 3), which provides, at the surface opposite to the monocrystalline substrate, a greater number of grain boundaries than in a thicker layer 2' as in FIG. 1. As a result, the polysilicon layer traps the electrical charges present at the surface more efficiently than a thicker layer.

In addition, since the polysilicon layer 2 is thinner than layer 2' in FIG. 1, it is also less rough and thus requires less polishing before bonding to the donor substrate. As a result, a smaller loss of material due to polishing is to be taken into account when forming the polysilicon layer.

What is claimed is:

1. A structure for radiofrequency applications, comprising:
   a monocrystalline substrate;
   a polycrystalline silicon layer directly on the monocrystalline substrate; and
   an active layer on the polycrystalline silicon layer intended to receive radiofrequency components;
   wherein at least a first portion of the polycrystalline silicon layer extending from an interface between the polycrystalline silicon layer and the monocrystalline substrate includes atoms selected from the group consisting of carbon and nitrogen located at grain boundaries of the polycrystalline silicon at a concentration of between 2% and 20%.

2. The structure of claim 1, wherein the whole polycrystalline silicon layer contains atoms selected from the group consisting of carbon and nitrogen.

3. The structure of claim 1, wherein a thickness of the polycrystalline silicon layer ranges from 200 nm to 1000 nm.

4. The structure of claim 1, wherein the polycrystalline silicon layer further comprises, on the at least a first portion containing carbon and/or nitrogen atoms, a second portion free from carbon and/or nitrogen atoms in that the concentration in carbon and/or nitrogen in the second portion is less than 0.5%.

5. The structure of claim 4, wherein a thickness of the at least a first portion of the polycrystalline silicon layer ranges from 10 nm to 200 nm.

6. The structure of claim 4, wherein a thickness of the polycrystalline silicon layer ranges from 20 nm to 500 nm.

7. The structure of claim 1, wherein the monocrystalline substrate comprises at least one of monocrystalline silicon having an electrical resistivity greater than 500 Ohm·cm, silicon carbide, and/or germanium.

8. The structure of claim 1, wherein the active layer comprises at least one of a semiconducting material, a dielectric material, a ferroelectric material, and a substructure comprising at least one cavity and at least one suspended element on the at least one cavity.

9. The structure of claim 1, wherein the structure further comprises a dielectric layer on the polycrystalline silicon layer, the active layer being on the dielectric layer.

* * * * *